US007900336B2

(12) United States Patent
Akinwande et al.

(10) Patent No.: US 7,900,336 B2
(45) Date of Patent: Mar. 8, 2011

(54) PRECISE HAND-ASSEMBLY OF MICROFABRICATED COMPONENTS

(75) Inventors: Akintunde Ibitayo Akinwande, Newton, MA (US); Blaise Laurent Patrick Gassend, Cambridge, MA (US); Luis Fernando Velasquez-Garcia, Boston, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 1358 days.

(21) Appl. No.: 11/404,676

(22) Filed: Apr. 14, 2006

(65) Prior Publication Data

US 2009/0113687 A1 May 7, 2009

(51) Int. Cl.
*B23Q 7/00* (2006.01)
(52) U.S. Cl. ............ 29/559; 29/281.5; 29/524; 200/11 D
(58) Field of Classification Search ............. 29/25.35, 29/270, 760, 524, 505, 281.5, 559; 215/225
See application file for complete search history.

(56) References Cited

U.S. PATENT DOCUMENTS

| | | | | |
|---|---|---|---|---|
| 3,939,788 A | * | 2/1976 | Schneible | 425/6 |
| 4,038,504 A | * | 7/1977 | McAnulty et al. | 200/11 DA |
| 4,406,376 A | * | 9/1983 | Berghahn | 215/224 |
| 4,444,326 A | * | 4/1984 | Musel | 215/209 |
| 5,129,531 A | * | 7/1992 | Beck et al. | 215/256 |
| 5,155,306 A | * | 10/1992 | Iijima et al. | 200/11 DA |
| 5,312,456 A | | 5/1994 | Reed et al. | |
| 5,569,272 A | | 10/1996 | Reed et al. | |
| 5,676,850 A | | 10/1997 | Reed et al. | |
| 5,806,152 A | * | 9/1998 | Saitou et al. | 24/662 |
| 5,961,849 A | | 10/1999 | Bostock et al. | |
| 5,961,949 A | | 10/1999 | Manev et al. | |
| 6,039,195 A | * | 3/2000 | Konefal et al. | 215/209 |
| 6,143,293 A | | 11/2000 | Weiss et al. | |
| 6,408,120 B1 | | 6/2002 | Dautartas | |
| 6,456,766 B1 | | 9/2002 | Shaw et al. | |
| 6,457,873 B1 | | 10/2002 | Heier et al. | |
| 6,612,450 B1 | * | 9/2003 | Buono | 215/228 |
| 6,647,036 B1 | | 11/2003 | Sun et al. | |

(Continued)

OTHER PUBLICATIONS

Luis Fernando Velasquez-Garcia, The Design, Fabrication and Testing of Micro-fabricated Linear and Planar Colloid Thruster Array, Submitted to the Department of Aeronautics and Astronautics in partial fulfillment of the Degree of Doctor of Philosophy at the Massachusetts Institute of Technology, May 2004, pp. 73-74, 99-123, 164-185.

(Continued)

*Primary Examiner* — Lee D Wilson
*Assistant Examiner* — Jamal Daniel
(74) *Attorney, Agent, or Firm* — Sampson & Associates, P.C.

(57) ABSTRACT

A hand assembled MEMS apparatus includes meso-scale microfabricated components adapted for being moved by hand relative to one another from a loose-fit preliminary alignment orientation to a relatively tight-fit assembled orientation. A microfabricated spring member is integrally disposed on one of the components to bias the other component towards the assembled orientation. A cam surface disposed on the other component is configured to slidably engage and move the spring member against its bias upon continued hand movement in the assembly direction. A microfabricated abutment is disposed to limit relative movement of the components in at least one direction other than the assembly direction. A microfabricated tactile feedback member is configured to disrupt the hand movement in the assembly direction once the components have substantially reached the assembled orientation.

28 Claims, 13 Drawing Sheets

U.S. PATENT DOCUMENTS

| | | | |
|---|---|---|---|
| 6,756,540 | B2 | 6/2004 | Hedler et al. |
| 6,881,074 | B1 | 4/2005 | McLenaghan |
| 6,954,578 | B2 | 10/2005 | Chang |
| 7,010,854 | B2 | 3/2006 | Eldridge et al. |
| 7,462,789 | B2 * | 12/2008 | Yamasaki et al. ........ 200/11 DA |
| 2008/0006604 | A1 * | 1/2008 | Keady ............................. 216/83 |
| 2008/0116163 | A1 * | 5/2008 | Sawyer ......................... 215/225 |
| 2009/0026363 | A1 * | 1/2009 | Cheung et al. ................ 250/282 |
| 2009/0026367 | A1 * | 1/2009 | Cheung et al. ................ 250/292 |
| 2009/0045038 | A1 * | 2/2009 | Worones et al. ......... 200/11 DA |
| 2009/0113687 | A1 * | 5/2009 | Akinwande et al. ............ 29/270 |
| 2009/0189065 | A1 * | 7/2009 | Hashimoto et al. ........... 250/282 |

OTHER PUBLICATIONS

B. Gassend, L. F. Velasques-Garcia, A. L. Akinwande and M. Martinez-Sanchez, Mechanical Assembly of Electrospray Thruster Grid, presented at the 29th International Electric Propulsion Conference (IEPC-2005-101), Princeton University,Oct. 31-Nov. 4, 2005, pp. 1-12.

N. Dechev, J. K. Mills, W. L. Cleghorn, Mechanical Fastener Designs for use in the Microassembly of 3D Microstructures, 2004 ASME International Mechanical Engineering Congress and RD&D Expo, Anaheim, California, Nov. 13-19, 2004, pp. 1-10.

E. E. Hui and S. N. Bhatia, Micromechanical Control of Cell-Cell Interaction, MTL Annual Research Conference 2006, 2006, 1 page.

M. Last, V. Subramaniam, K. S. J. Pister, Out of Plane Motion of Assembled Microstructures using a Single Mask SOI Process, Transducers 2005 conference.Jun. 5-9, 2005, pp. 684-687.

R. M. Bostock, J. D. Collier, R.-J. E. Jansen, R. Jones, D. F. Moore and J. E. Townsend, Silicon Nitride Microclips for the Kinematic Location of Optic Fibers in Silicon V-Shaped Grooves, Journal of Micromachining and Microengineering, 1998, pp. 343-360.

R. Prasad, K-F Bohringer, N.C. MacDonald, Design, Fabrication and Characterization of Single Crystal Silicon Latching Snap Fasteners for Micro Assembly, Proc. ASME Int. Mech. Eng. Congress and Exposition (IMECE'95), San Francisco, CA, Nov. 1995, 7 pgs.

Hongtao Han and Lee E. Weiss and Michael L. Reed, Micromechanical Velcro, Journal of MicroElectroMechanical Systems, 1 (1), Mar. 1992, pp. 37-43.

Alexis Christian Weber, Precision Passive Alignment of Wafers, Submitted to the Department of Mechanical Engineering in Partial Fulfillment of the Requirements for the Degree of Master of Science in Mechanical Engineering at the Massachusetts Institute of Technology, Feb. 2002, pp. 1-102.

* cited by examiner

PRECISE HAND-ASSEMBLY OF MICROFABRICATED COMPONENTS

GOVERNMENT SPONSORSHIP

This invention was made with government support under Contract Numbers FA9550-04-C-0118 and FA9650-05-C-0049, awarded by the Air Force, Contract Number W911QY-05-1-0002, awarded by the Army, and Contract Number N66001-04-1-8925, awarded by the Navy. The government has certain rights in the invention.

TECHNICAL FIELD

This invention relates to microfabricated components, and more particularly to meso-scale micro-fabricated components configured for hand-assembly while maintaining precision.

BACKGROUND INFORMATION

Throughout this application, various publications, patents and published patent applications may be referred to by an identifying citation. The disclosures of the publications, patents and published patent applications referenced in this application are hereby incorporated by reference into the present disclosure.

Microfabrication techniques, such as photolithography commonly used in the microelectronics industry to produce microprocessors and memory chips, have been increasingly used to fabricate other types of products, such as MEMS (Micro Electro-Mechanical Systems) devices and the like. These techniques advantageously enable the production of increasingly miniaturized devices, for use in products of ever decreasing size.

Those skilled in the art will recognize that these microfabrication techniques are particularly well suited to the production of relatively small, monolithic, two-dimensional (2-D) devices, due to their precise, deposited-layer fabrication approach. However, the inherent two-dimensionality of microlithography, in combination with the limited depth of vision associated with the small wavelengths necessitated by its micrometer precision capability, tends to militate against its use for relatively large (meso-scale) 3-D assemblies. This phenomenon thus effectively precludes the production of devices having larger aspect ratios, and/or larger out-of-plane dimensions. This microfabrication approach also tends to be ill-suited for larger, meso-scale devices in general, due to the increasing complexity associated with designing 3-D features for nominally microlithographic 2-D fabrication. In addition, as these devices become larger and more complex, there tends to be greater opportunity for generally incompatible process steps and/or parasitic errors, etc.

One attempt to address these concerns includes the microfabrication of discrete components, which are subsequently fastened to one another. This approach provides for the possibility of effectively isolating incompatible process steps to separate components, while also enabling the fabrication of larger, 3-D assemblies. Disadvantageously, however, it tends to be difficult to join these discrete components with the same level of precision (e.g., micrometer level), to which the components themselves are fabricated. As such, the components are either joined with less precision, which may defeat the purpose of using such a precise fabrication approach in the first place, or substantial costs may be incurred through the use of high precision assembly systems.

Micro-machined clips have been used to align and hold optical fibers, to position structures perpendicular to the substrate and as general purpose in-plane fasteners. LEGO-like systems to align and bond wafers for packaging have been proposed. Others have proposed micro-mechanical Velcro to mechanically bind wafers, without providing for relative positioning of the wafers. However, these approaches tend to either require complex assembly equipment, or result in relatively high assembled misalignments. (See, e.g., Bostock, et al., "Silicon Nitride Microclips for the Kinematic Location of Optic Fibers in Silicon V-Shaped Grooves", Journal of Micromechanics and Microengineering, Vol. 8, 1998, pp. 343-360. Last, et al., "Out of Plane Motion of Assembled Microstructures using a Single-Mask SOI Process," Proc. 13th International Conference on Solid-State Sensors, Actuators and Microsystems, IEEE, New-York, June 2005. Prasad, et al., "Design, Fabrication, and Characterization of SCS Latching Snap Fasteners for Micro Assembly," Proc. ASME International Mechanical Engineering Congress and Exposition (IMECE), ASME, New-York, November 1995. Lee, et al., "A Morphology-Independent Wafer Level Rivet Packaging with Lego-Like Assembly," Proc. 13th International Conference on Solid-State Sensors, Actuators and Microsystems, IEEE, New-York, June 2005. Han, et al., "Micromechanical Velcro," Journal of MicroElectroMechanical Systems, Vol. 1, No. 1, March 1992.)

A need, however, exists for an assembly approach and system capable of enabling discrete, high-precision microfabricated components to be easily hand-assembled without substantial loss of precision.

SUMMARY

In one aspect of the present invention, a hand assembled MEMS apparatus includes meso-scale first and second components, at least one of which is microfabricated, and which are adapted for being moved by hand relative to one another in an assembly direction from a relatively loose-fit preliminary alignment orientation to a relatively tight-fit assembled orientation. A microfabricated spring member is integrally disposed on one of the first and second components, and configured to bias the other component towards the assembled orientation. A cam surface integrally disposed on the other component is configured to slidably engage and move the spring member against its bias upon continued hand movement in the assembly direction. A microfabricated abutment disposed on one of the components is disposed to limit relative movement of the components in at least one direction other than the assembly direction. A microfabricated tactile feedback member is configured to disrupt the hand movement in the assembly direction once the components have substantially reached the assembled orientation.

In another aspect of the invention, a method for fabricating a hand assemblable apparatus includes providing a meso-scale first and second components, at least one of which is microfabricated. The components are adapted for being moved by hand relative to one another in an assembly direction, from a relatively loose-fit preliminary alignment orientation to a relatively tight-fit assembled orientation. A microfabricated spring is integrally disposed on one of the components to bias the other component towards the assembled orientation. A cam surface is integrally disposed on the other component to slidably engage and move the spring member against its bias upon continued hand movement in the assembly direction. A microfabricated abutment is disposed to limit relative movement of the components in at least one direction other than the assembly direction. A microfabricated tactile feedback member is disposed on at least one of the components to disrupt the hand movement in the assembly direction once the components have substantially reached the assembled orientation.

In a still further aspect of the invention, a hand assembled MEMS apparatus includes microlithographic, meso-scale first and second components adapted for being moved relative to one another in an assembly direction, and a microlithographic spring member integrally disposed on one of the components to bias the other component towards an assembled orientation. A microlithographic cam surface is integrally disposed on the other component to move in a rotational assembly direction to slidably engage and move the spring member against its bias. A plurality of microlithographic abutments disposed on at least one of the components is disposed to limit movement of the components relative to one another in at least one direction other than the rotational assembly direction. A microlithographic tactile feedback member disposed on at least one of the components is configured to disrupt movement in the assembly direction once the components have substantially reached the assembled orientation.

BRIEF DESCRIPTION OF THE DRAWINGS

The above and other features and advantages of this invention will be more readily apparent from a reading of the following detailed description of various aspects of the invention taken in conjunction with the accompanying drawings, in which.

DETAILED DESCRIPTION

Figure 1:
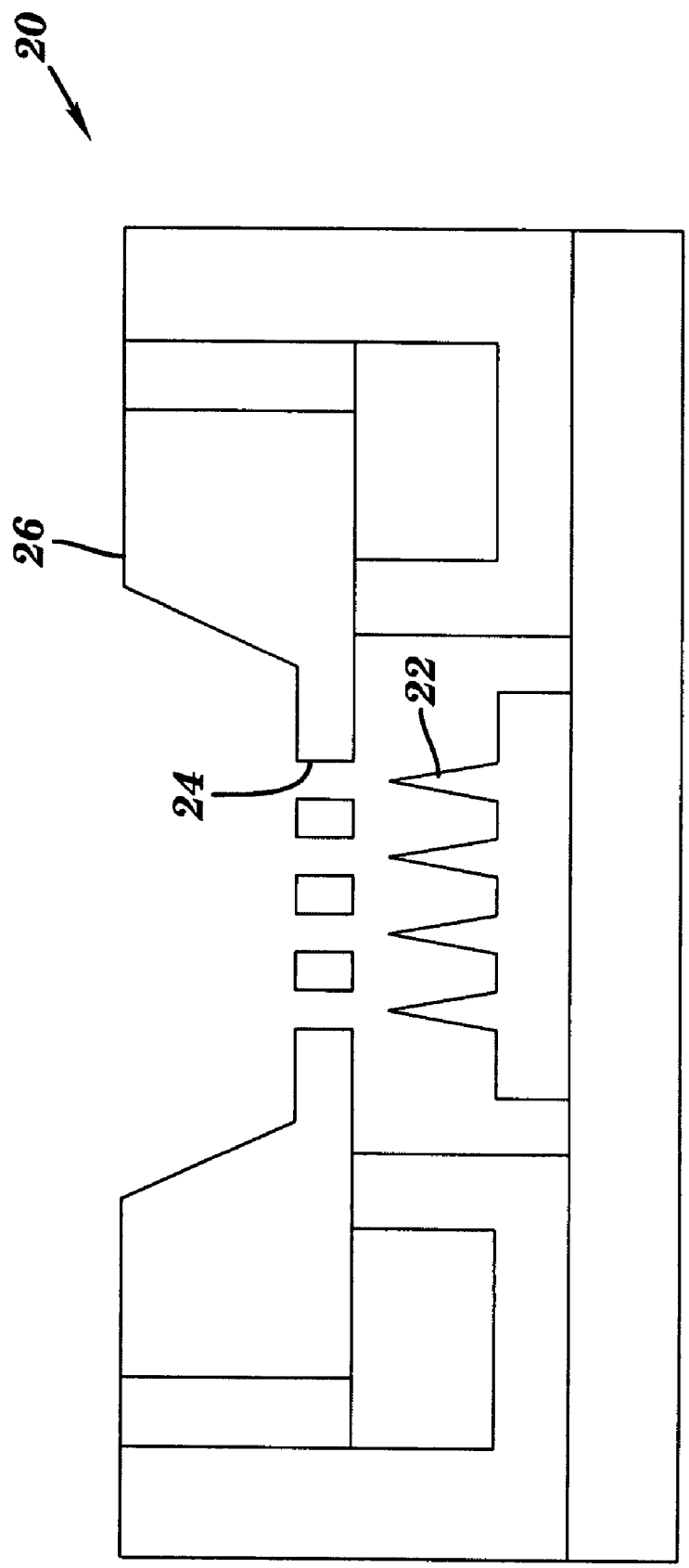
FIG. 1 is an elevational, cross-sectional schematic view of an electrospray thruster of the prior art.

In the following detailed description, reference is made to the accompanying drawings that form a part hereof, and in which is shown by way of illustration, specific embodiments in which the invention may be practiced. These embodiments are described in sufficient detail to enable those skilled in the art to practice the invention, and it is to be understood that other embodiments may be utilized. It is also to be understood that structural, procedural and system changes may be made without departing from the spirit and scope of the present invention. The following detailed description is, therefore, not to be taken in a limiting sense, and the scope of the present invention is defined by the appended claims and their equivalents. For clarity of exposition, like features shown in the accompanying drawings shall be indicated with like reference numerals and similar features as shown in alternate embodiments in the drawings shall be indicated with similar reference numerals.

Briefly, embodiments of the present invention include apparatuses and approaches for fabricating high-precision MEMS (Micro Electro-Mechanical Systems) components which may be assembled into similarly precise meso-scale assemblies using low-precision hand assembly techniques. The individual components are fabricated using conventional microfabrication (e.g., microlithographic) techniques, and include a series of springs and fixed features that effectively self-locate into precisely defined orientations upon mating. The components may thus be assembled to levels of precision within the same order of magnitude (i.e., tens of microns or less in a given dimension) commonly provided by the microfabrication techniques themselves. This approach thus enables the microfabrication of devices which otherwise may not otherwise be capable of microfabrication, e.g., due to relatively large component size, aspect ratios, and/or parasitic errors, etc. These embodiments include provision for tactile feedback to the hand-assembler to avoid over-tightening or otherwise damaging the components during assembly.

At least two distinct embodiments are disclosed, which respectively use: 1) pure rotary motion; and 2) a combination of linear/rotary, or screw-type motion.

Embodiments of this invention thus involve more than merely a reduction in size of conventional macro-scale assemblies. Rather, the idea of using particularly precise microfabrication techniques to produce components that are then to be connected using imprecise hand assembly techniques, tends to be counter-intuitive. Also, the inherent two-dimensionality of conventional microfabrication techniques, in combination with the limited depth of vision associated with the small optical wavelengths necessitated thereby, tends to teach away from their use for relatively large (meso-scale) 3-D assemblies.

Where used in this disclosure, the term "meso-scale" refers to nominally hand-holdable or hand-sized components, namely, those having at least one dimension within a range of about 0.5 to 10 cm or more, to facilitate hand manipulation and/or hand assembly. The term "microfabrication" refers collectively to technologies used to fabricate components on a micrometer-sized, or micrometer-toleranced scale, including conventional micromachining, semiconductor processessing, microelectronic fabrication, semiconductor fabrication, microlithography, MEMS fabrication, and integrated circuit fabrication technologies. Microfabrication thus includes those technologies commonly used on silicon wafers, glass, plastics, and the like, to fabricate integrated circuits, microsensors, inkjet nozzles, flat panel displays, laser diodes, compact discs, etc., and may also include techniques such as electro-discharge machining, spark erosion machining, laser drilling/cutting, and imprinting, casting and molding, etc. The term "axial" or "longitudinal" when used in connection with an element described herein, refers to a direction relative to the element, which is substantially parallel to its axis of rotation during assembly as shown and described herein. Similarly, the term "transverse" refers to a direction other than substantially parallel to the axial direction.

Referring now to the Figures, embodiments of the present invention will be more thoroughly described. Aspects of these embodiments may be applied to nominally any type of multiple-component microfabricated device. For ease of description, these aspects will be described with respect to two particular devices chosen to demonstrate the aforementioned pure rotational, and screw-type assembly motions. These exemplary devices include a generalized electrospray thruster, and a generalized linear quadrupole, with the understanding that the teachings hereof may be applied to nominally any other devices without departing from the spirit and scope of the invention.

Turning now to FIG. 1, electrospray thrusters 20 have been investigated for use in the propulsion of various devices, such as earth orbiting satellites and other types of spacecraft. In these devices, an electrostatic field is used to extract ions or charged droplets from a liquid placed at the tip of needles (electrode) 22. Typically kilovolt potential differences are required to startup and run the thruster, to generate thrusts of micronewtons or less per needle. In order to increase thrust levels, arrays of needles 22 must be used. Microfabrication techniques are well suited to producing such arrays with relatively high needle densities.

In order to maximize the packing density of needles in the array, precise alignment between the needles 22 and the holes 24 in the extractor grid 26 is needed. Due to their geometries and discrete functions, it is desirable to fabricate the electrode/needle array 22 and grid 26 as discrete components. These components may be fastened to one another with the desired alignment precision using wafer bonding techniques. However, these techniques involve relatively high temperatures and disadvantageously add complexity in the fabrication process.

Figure 2:
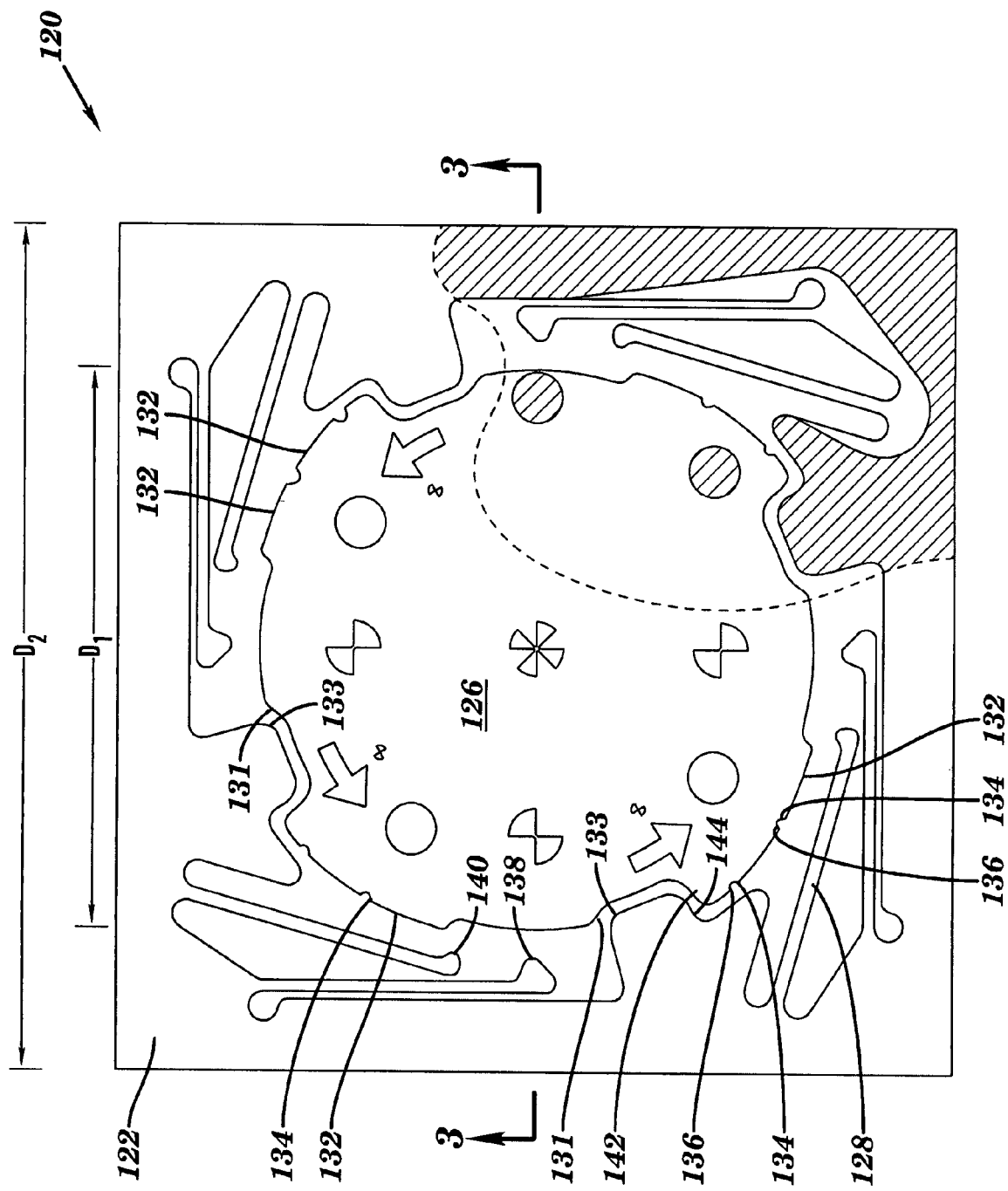
FIG. 2 is a plan view, with portions broken away, of a generalized electrospray thruster fabricated in accordance with an embodiment of the subject invention.
Figure 3:
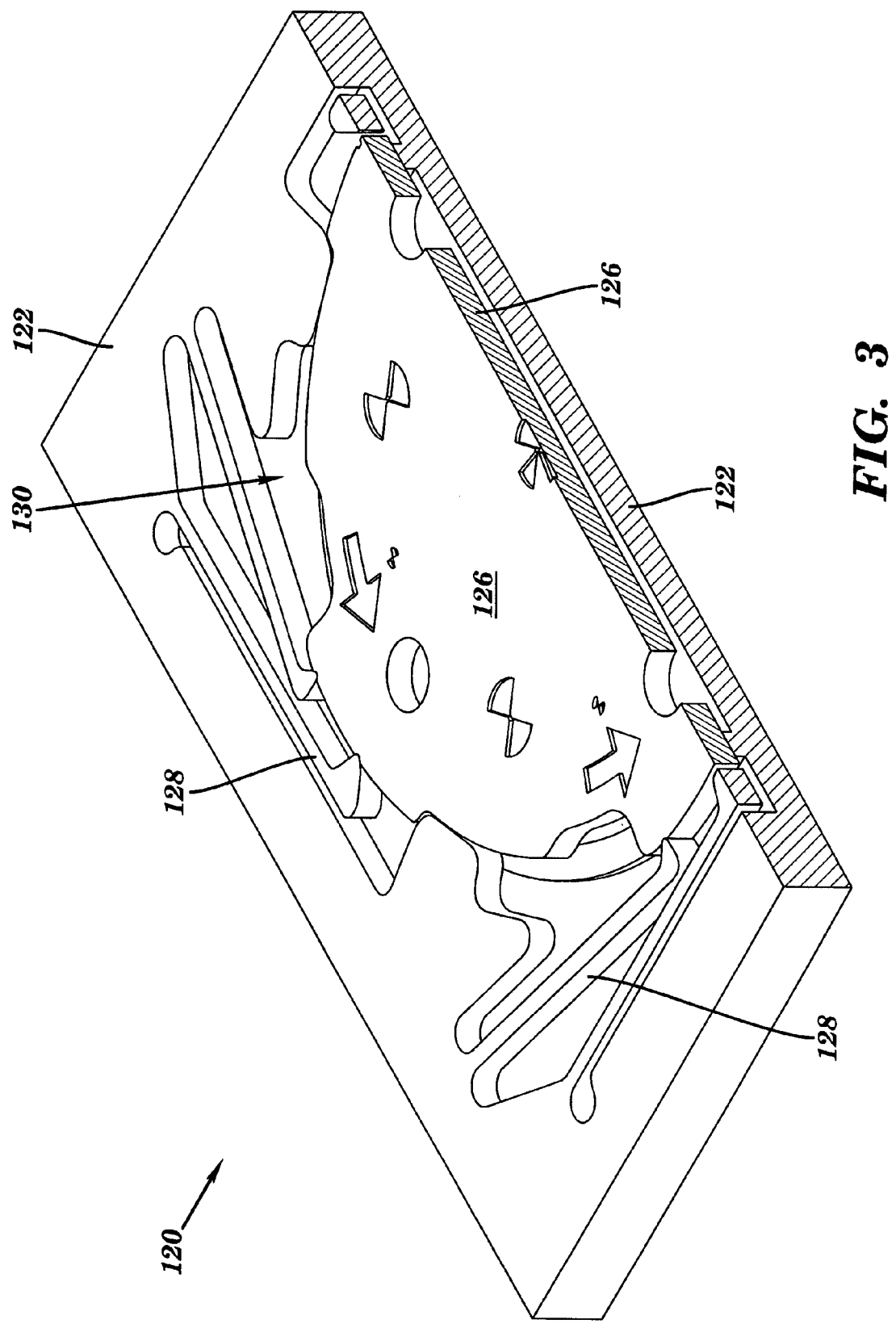
FIG. 3 is a perspective, cross-sectional view taken along 3-3 of FIG. 2.

Turning now to FIGS. 2 & 3, an exemplary embodiment of the present invention is shown and described in the form of a generalized grid 126 and electrode 122, with various features, such as the needles, etc., omitted for clarity. As shown, this embodiment demonstrates a microfabricated MEMS assembly 120 in which a meso-scale first component, e.g., in the form of a grid 126 having a transverse dimension $D_1$ of about 2.5 cm, and a meso-scale second component, e.g., in the form of a grid support (electrode) 122 having a transverse dimension $D_2$ of about 4.5 cm, are microfabricated separately, to precise micrometer level tolerances, and then assembled using relatively low-precision manual assembly techniques, while maintaining high assembled precision.

The grid support 122 includes a series of spring fingers 128 disposed in spaced relation about the periphery of a recess 130 disposed therein. The recess 130 is sized and shaped to receive grid 126 therein, between fingers 128. Moreover, recess 130 is sized and shaped so that an individual (i.e., the assembler) hand assembling the components, initially need only place grid 126 into loose-fitting orientation therein as shown. This loose-fitting orientation may typically be several orders of magnitude less precise than the assembled precision as discussed below.

Grid 126 includes a first set of cam surfaces 131 configured for an intermediate fit between respective abutments 133. During rotational operation, one or more of the cam surfaces 131 may slidably engage their respective abutments 133 to cam the grid towards its centered orientation.

Grid 126 also includes a second set of cam surfaces 132 disposed to engage distal ends 138 and 140 of fingers 128 during the assembly of the grid, to move spring members 128 against their bias, as will be discussed in greater detail hereinbelow. A plurality of microfabricated (e.g., microlithographic) abutments 134 & 136, respectively form leading and trailing edges of notches disposed within cam surfaces 132. During rotation of the grid, the bias of the fingers 128 will drop distal ends 138, 140 thereof into the notches. Engagement of distal ends 138, 140 with the trailing edge abutments 136 serves to disrupt the rotational movement of grid 126 to provide tactile feedback during assembly, as will be discussed hereinbelow. Similarly, engagement of the distal ends with the leading edge abutments 134 serves to restrict motion in the reverse rotational (i.e., the disassembly) direction. The grid 126 and grid support 122 also include mutually opposed stops 142, 144, which serve to prevent excessive rotation in the disassembly direction.

Figure 4A:
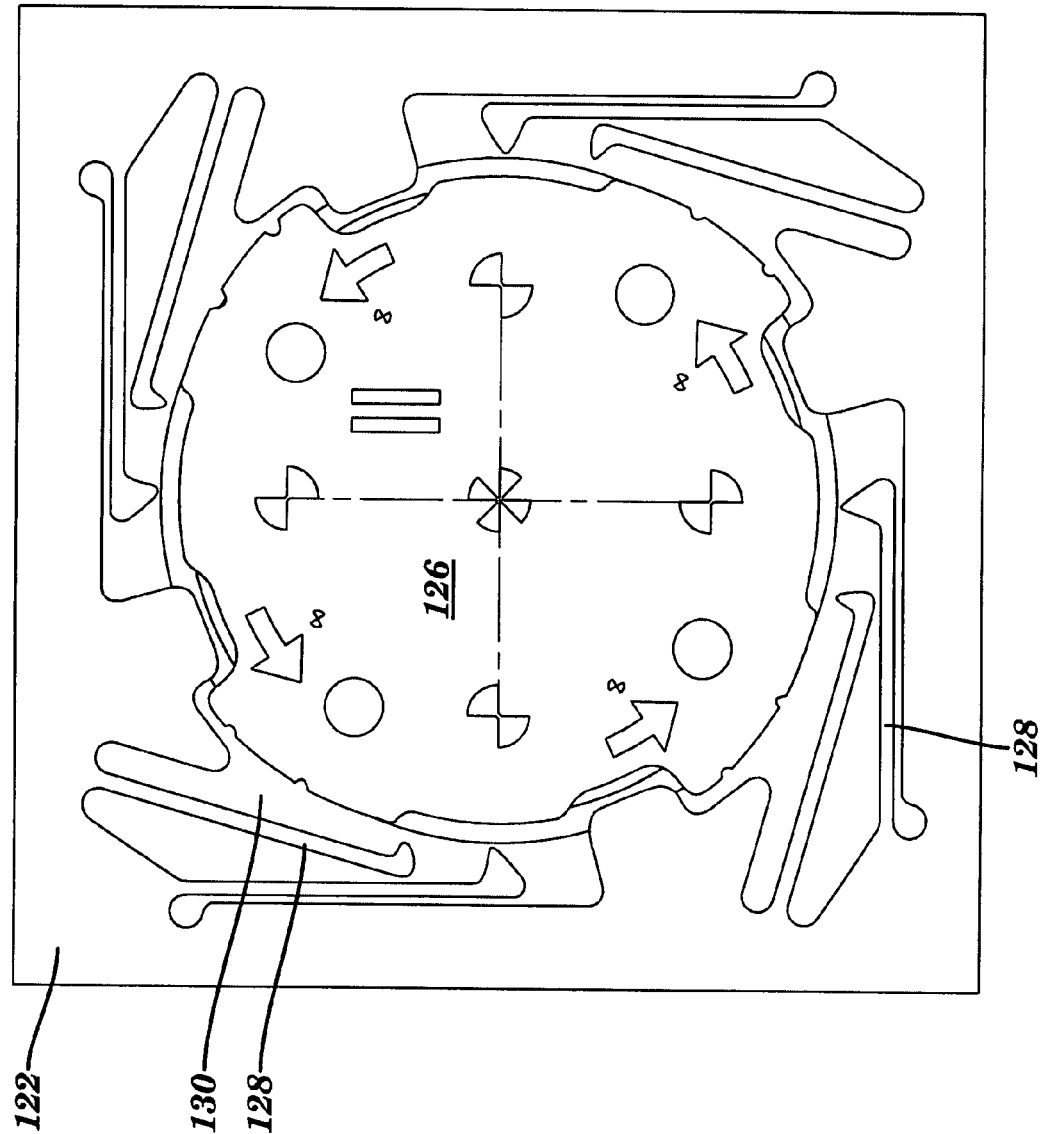
FIGS. 4A-4C are views similar to that of FIG. 2, during various steps in the assembly thereof.
Figure 4B:
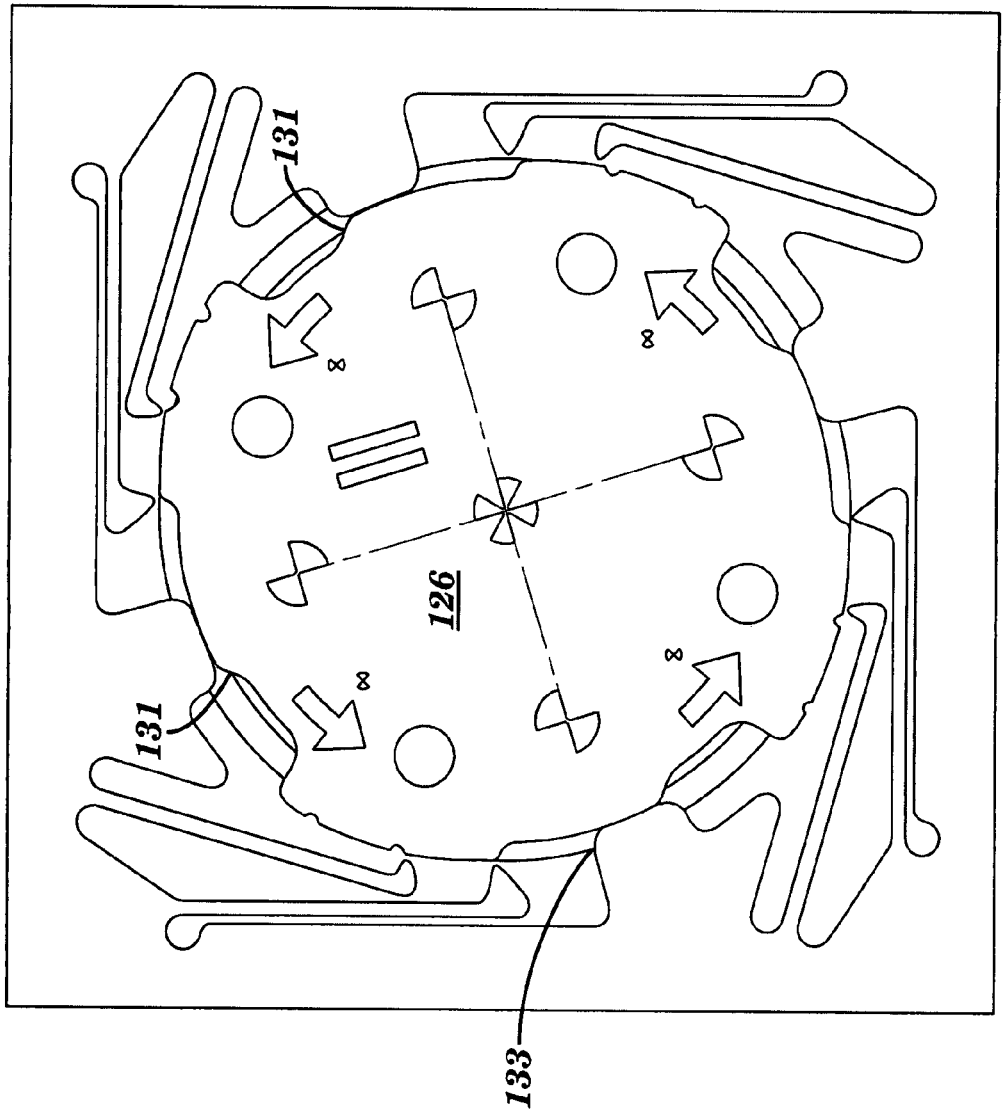
Figure 4C:
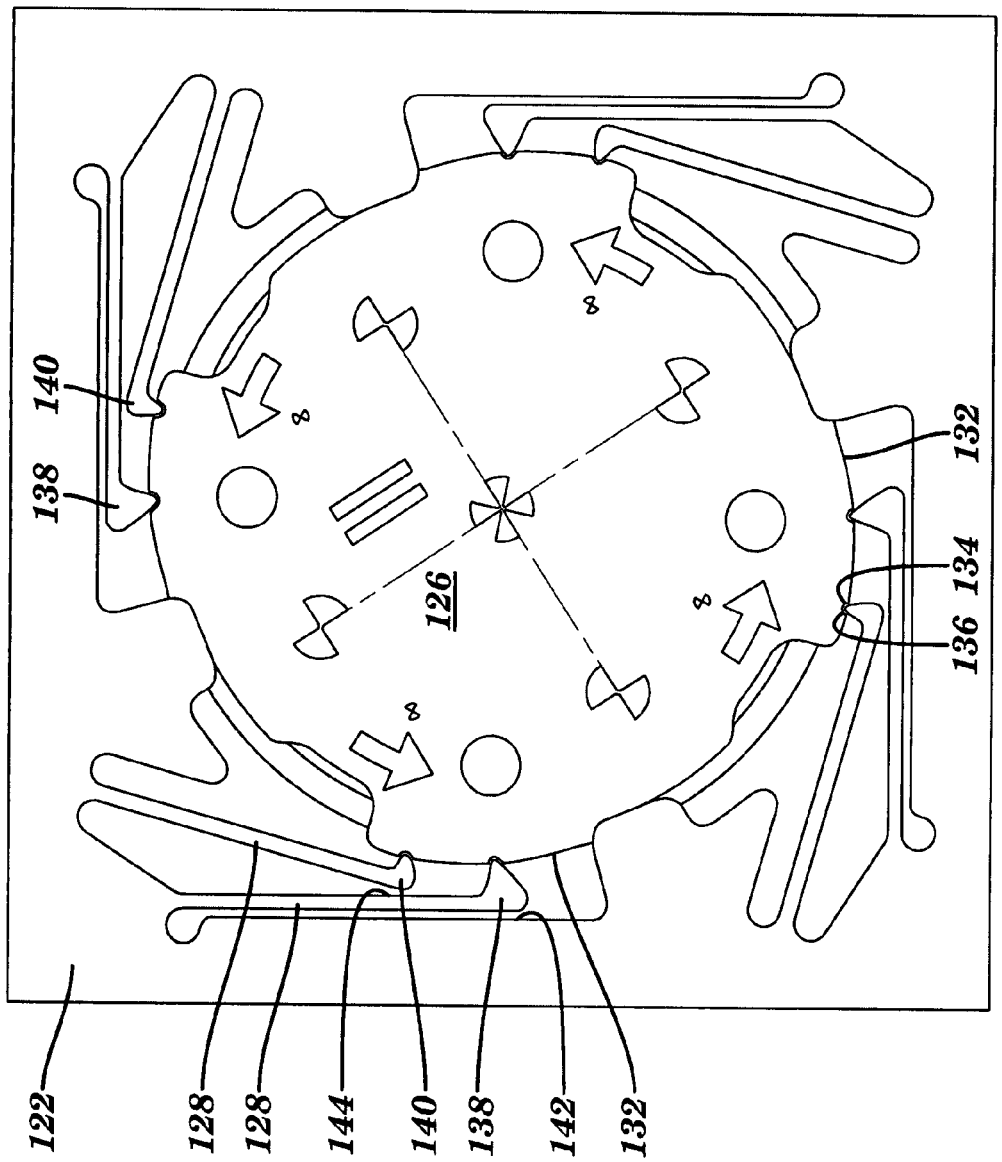

Turning now to FIGS. 4A-4C, assembly operation of this embodiment is described. Grid 126 may be assembled onto grid support 126 by initially placing grid 126 into loose-fitting orientation (e.g., with millimeter scale clearance) within recess 130 as shown in FIG. 4A. The assembler may then rotate the grid in the assembly direction (e.g., counter-clockwise in the embodiment shown). As the grid rotates, the cam surfaces may engage abutments 133 to align the grid 126 to an intermediate clearance/alignment position (e.g., within about 50 μm of the center of the recess 130), as shown in FIG. 4B. Upon continued rotation, cam surfaces 132 will engage distal ends 138, 140 of spring fingers 128, to flex the fingers against their bias.

It should be noted that the fingers 128 are relatively long and slender (e.g., having a length of about 1 cm, and a width of about 500-1000 μm in many embodiments), which provides the relatively brittle microfabricated structure with the desired flexibility, albeit at the expense of relatively high fragility. As such, fingers 128 tend to be delicate, and susceptible to breakage, particularly as a result of over-extension during hand assembly. For example, in particular embodiments in which the fingers 128 are between about 700 and 1000 μm wide, they are flexible, but may only tolerate a few hundred micrometers of deflection. These embodiments have thus been provided with various provisions for protecting them from accidental damage. One such provision includes placement of the fingers on the grid support 122, where they tend to be better sheltered than they would be on the periphery of the grid 126. This helps to protect them until assembly time.

In addition, as discussed above, when the grid 126 is first placed within the grid support 122 (FIG. 4A), the assembler need only place it in a relatively loose-fitting alignment (e.g., within about 0.5 to 1 mm of its intended location in meso-scale embodiments requiring an ultimate locational accuracy of tens of micrometers) for it to fall into the same plane as grid support 122. From this position, the grid 126 may be wiggled around without risk to the fingers 128, as grid stops (abutments) 133 prevent it from coming into contact with the fingers. Fingers 128 are thus protected from overextension by the interaction of cam surface 131 and abutment 133, which helps to prevent excessive misalignment of the components, particularly once grid 126 has been rotated far enough to engage the fingers. Further protection from overextension is provided by finger stops 142, formed as a wall portion of support superposed with distal ends 138 of the fingers, and by finger stops 144 formed as medial portions of fingers superposed with distal ends 140 of the fingers. These finger stops 142, 144 thus serve as additional means for avoiding overextension of the fingers, such as due to rough handling during component assembly. Finally, redundant fingers 128 are provided in the event some fingers do break.

Referring now to FIG. 4C, rotation of grid 126 is continued in the assembly direction, which serves to slide distal ends 138, 140 further along cam surfaces 132 until they drop, under the bias of the fingers, into the notches formed by leading and trailing abutments 134, 136, respectively. As mentioned hereinabove, this engagement with trailing abutments 136 disrupts the rotational movement of grid 126 to provide tactile feedback alerting the assembler that the fully assembled orientation has been reached. Similarly, engagement of the distal ends with the leading edge abutments 134 serves to restrict motion in the reverse rotational (i.e., the disassembly) direction, i.e., to help maintain grid 126 and grid support 122 in their assembled positions. The grid 126 and grid support 122 also include mutually opposed stops 142, 144, which serve to prevent excessive rotation in the disassembly direction.

Once assembled, the grid 126 is firmly held in place by the relatively high axial stiffness of the microfabricated fingers 128. The lateral flexibility of the fingers allows the assembly to accommodate differential thermal expansion of the components or portions thereof, or consistent over/under-etching of the side-walls during processing. Moreover, as mentioned above, this assembly approach enables the processes and material selection used to fabricate the grid 126 and the grid support 122 to be decoupled from one another. For example, temperature sensitive materials such as PTFE (Teflon®, DuPont) may be placed between grid 126 and support 126 without being damaged during fabrication/assembly (this is not possible, for example, with many conventional microfabrication techniques such as fusion bonding). Similarly, materials of one of the components may be altered without making similar alterations to the other component.

Having described embodiments of the present invention, the following is a description of the fabrication thereof. An exemplary process may require only three photo-masks: one for the alignment marks that appear on the device, one to describe the recess to be etched in the bottom wafer, and one to delineate the grid and grid support portions on the top wafer. In the embodiment shown, since the grid 126 fits into empty space within the grid support 126, the grid 126 and portions 158 of grid support 122 may be combined on a single mask.

Figure 5:
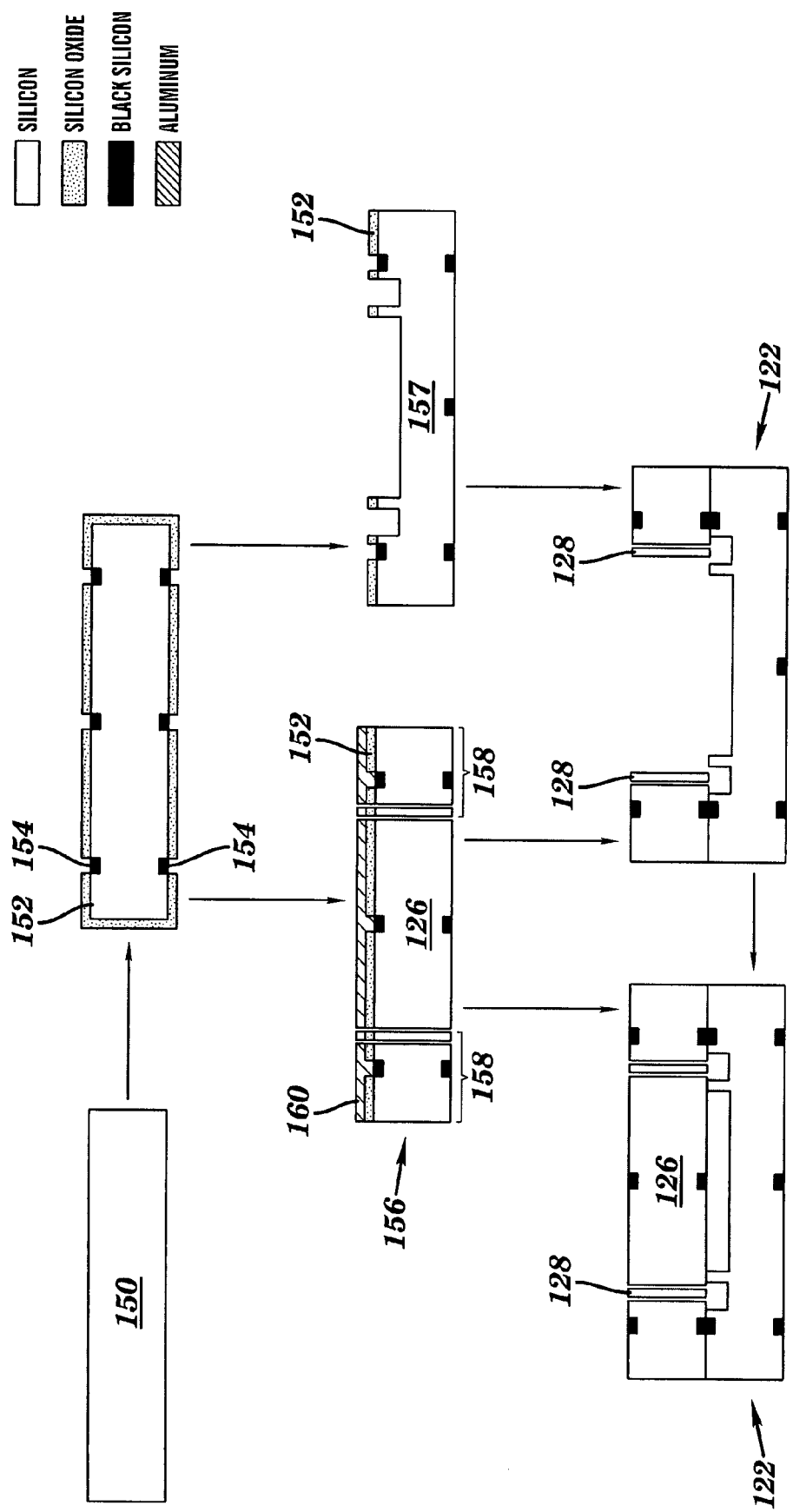
FIG. 5 is a series of simplified, cross-sectional views taken along 3-3 of FIG. 2, of various steps in the fabrication of the embodiment of FIGS. 3-4C.

Referring now to FIG. 5, exemplary fabrication begins with double side polished (e.g., 650 μm thick) silicon wafers 150. An oxide 152 is grown to protect the wafers from surface scratches which may prevent subsequent bonding. Alignment marks 154 are successively patterned on both sides of each wafer (step 1). The alignment marks may be patterned by spinning a thin photo-resist on both sides of the wafer, and exposing the sides to an alignment mark mask. After development, a buffered oxide etchant (BOE) is used to etch through the oxide at the unmasked points at the alignment mark locations. A chlorine-based plasma treatment may then be used to blacken the underlying silicon to form the marks 154. The photo-resist may then be stripped using an oxygen plasma and a piranha ($H_2O_2/H_2SO_4$ 1:3) bath. After this initial preparation step, the wafers are separated into tops 156 and bottoms 157, which undergo separate processing.

The top wafer 156 is selectively etched to form fingers 128 in portions 158, and is then etched through, e.g., with Deep Reactive Ion Etching (DRIE) to separate portions 158 (of grid support 122) from grid 126 (step 2a). In particular embodiments, it is desirable to obtain the straightest possible sidewalls for the grid 126 and fingers 128, since as discussed above, it is the contact between the two that determines the precision of assembly. For this reason, an aluminum etch mask 160 may be used when DRIE etching the top wafer 156, since aluminum is not measurably etched by the DRIE process. By using it (e.g., in combination with a thin photo-resist) instead of thick photo-resist, those skilled in the art will recognize that one may obtain better feature transfer from the optical mask, and avoid taper caused by resist thinning near the edge of features. This may be accomplished by sputtering a layer of aluminum 160 (e.g., 0.2 μm thick) and then applying a thin photoresist thereon, which may then be patterned with the desired shape of the grid 126 and grid support portions 158 and fingers 128, etc. The aluminum is etched with aluminum etchant pan etch, and the underlying oxide with BOE. DRIE may then be used to etch through the wafer.

A recess is DRIE etched in the bottom wafer (step 2b), to form recesses below the fingers to prevent the fingers 128 (FIG. 4A-4C) from bonding to the bottom wafer 157. The wafers are cleaned (e.g., with an oxygen plasma and piranha) and the protective oxide stripped (e.g., with hydrofluoric acid (HF)). The alignment marks 154 of portions 158 are then aligned with those of bottom wafer 157 and then fusion bonded to one another (step 3). The completed devices are ready for hand assembly of the grid 122 (step 4).

Referring now to FIGS. 6-8D, an alternate embodiment of the present invention is shown as a linear quadrupole assembly 220. Those skilled in the art will recognize that linear quadrupoles are devices commonly used to filter species based on their specific charge, and are often used in mass spectrometry. Depending on the stability region where they operate, linear quadrupoles may require electrode aspect ratios as large as 60 or more to be able to resolve light ions (20 amu or less) with good resolution (1% or better). The resolution and ion transmission of these devices is greatly influenced by the misalignment in the relative positions of the rods (electrodes) 226, as well as its taper.

Assembly 220 is a MEMS device that uses electrodes 226 having aspect ratios of 60 or more, and diameters down to 500 micrometers. This assembly 220 uses a system of meso-scaled DRIE-patterned springs 228 that allow a hand-assembled alignment precision of within about 5-20 micrometers or less. The precision of the diameter of electrodes 226 is also about 5 micrometers or less. Advantages of this quadrupole concept over prior approaches is its manual assembly, and that the rods 226 may be mounted and dismounted as desired, making the same "spring head" (support) component 222 (MEMS structure that includes the meso-scaled springs 228, whose function is to grab, align and lock the electrode rods) reusable with different aspect ratios to be able to perform under different conditions of pressure, voltages, frequencies, etc.

This embodiment thus demonstrates another microfabricated MEMS assembly in which a meso-scale first component (electrodes/rods) 226 (e.g., having a length of within about 0.5 to 5 cm, and a diameter of about 0.5 mm), and a meso-scale second component (e.g., spring head support 222 having a transverse dimension $D_1$ (FIG. 7A) of about 0.7 to 0.8 cm) are microfabricated separately, to precise dimensional tolerances, and then assembled using relatively low-precision manual assembly techniques, while maintaining microfabrication-level assembled precision.

Figure 6:
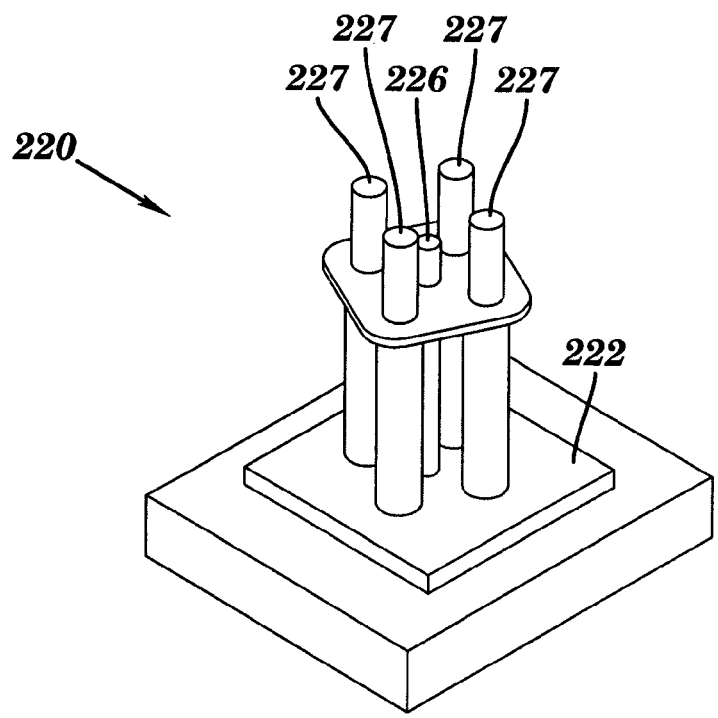
FIG. 6 is a perspective view of an alternate embodiment of the subject invention.

Referring now to FIG. 6, assembly 220 includes spring head component 222 which supports a series of hand assembled meso-scale stainless steel rods 226 (one shown). As also shown in this Figure, a series of (four) columns 227 are spaced about each rod 226. These columns 227 can be made larger than the rods 226, and therefore can provide additional structural support and enhance the precision of the assembly. These columns 227 may be assembled in the same manner as the rods 226, and thus will not be discussed in detail.

Figure 7B:
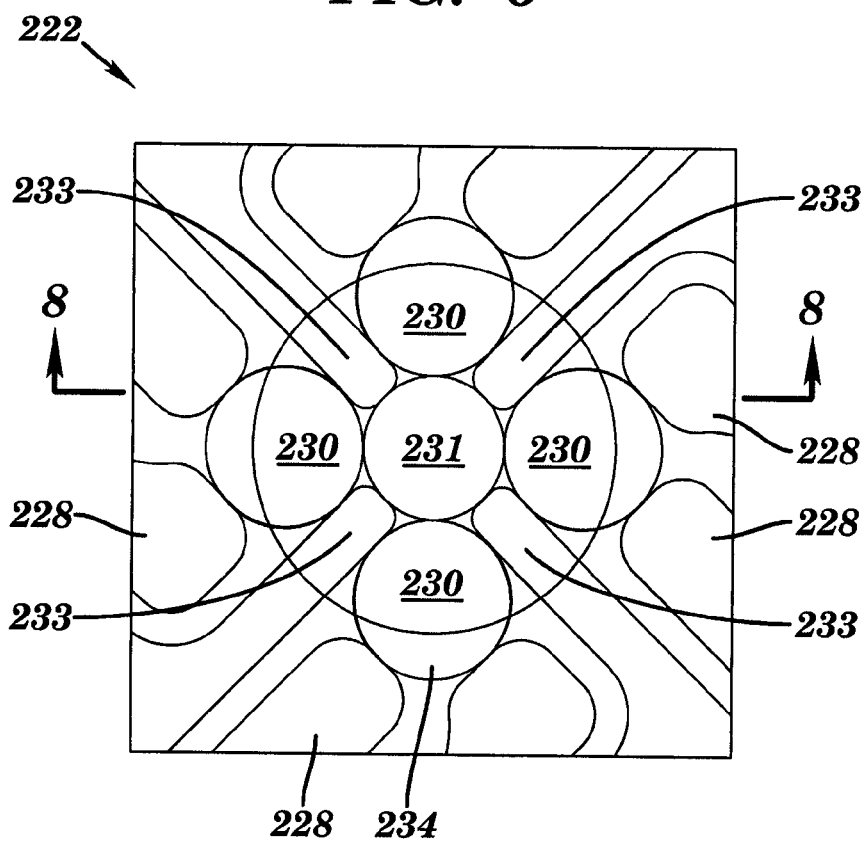
FIG. 7B is a plan view, on a further enlarged scale, of a portion of the embodiment of FIG. 7A.
Figure 7A:
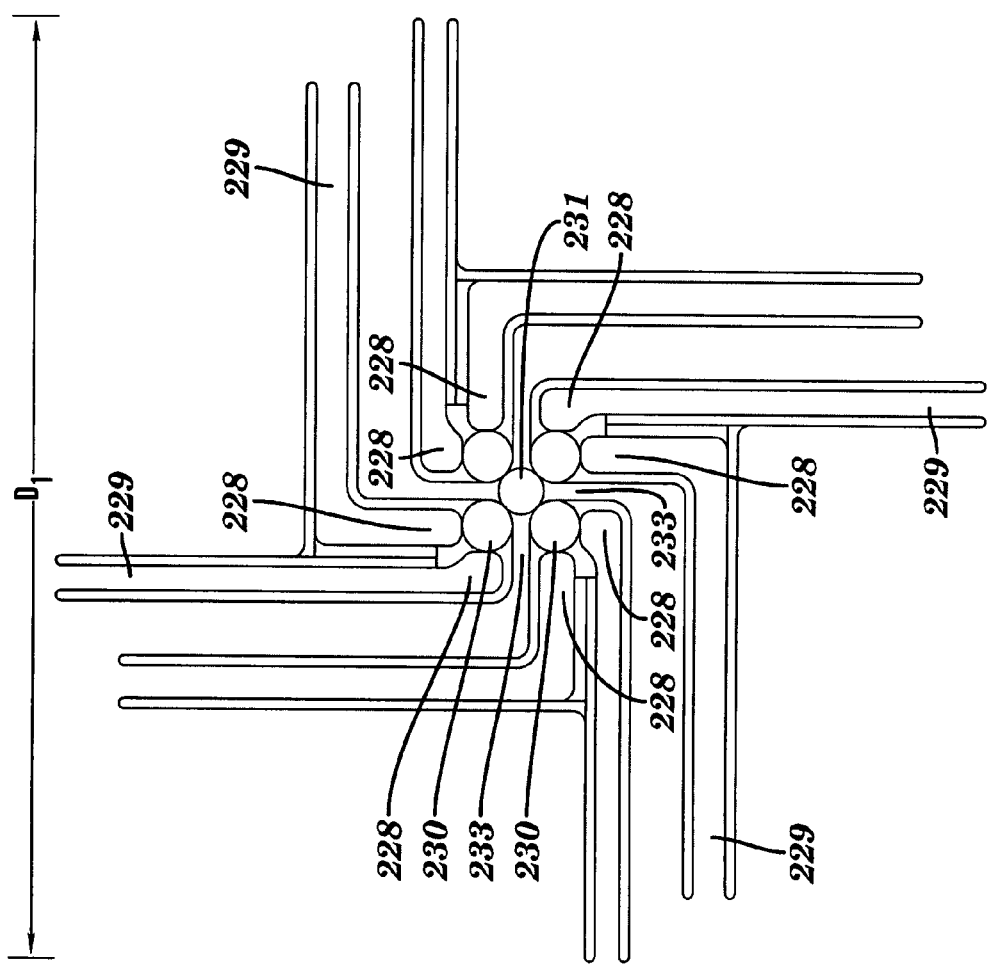
FIG. 7A is a plan view, on an enlarged scale, with portions broken away, of a portion of the embodiment of FIG. 6.

Turning now to FIGS. 7A & 7B, spring head support 222 includes a series of spring fingers 228 disposed in spaced relation about a series (e.g., four as shown) of cavities 230 disposed therein. The cavities 230 are disposed about a central, active area 231 of the quadrupole, and are each sized and shaped to receive a rod 226 therein, between microfabricated (e.g., microlithographic) spring fingers 228 and microfabricated (e.g., microlithographic) stationary abutments 233.

Each cavity 230 is sized and shaped so that an individual (i.e., the assembler) hand assembling the components, initially need only place rod 226 into loose-fitting orientation therein, whereupon a cam surface 232 (FIG. 8D) disposed on rod 226 will engage fingers 228.

This loose sliding fit enables the rod 226 to be easily placed by hand into a cavity 230, with cam surfaces 232 initially clearing or sliding past abutments 233 and distal ends of fingers 228. Upon continued insertion, such as coupled with a twisting rotational motion about its longitudinal axis, cam surface 232 may slidably engage distal ends of fingers 228, to move spring members 228 against their bias, which serves to press the rod against abutments 233. Abutments 233 thus serve to limit movement of the rods in a direction substantially transverse to the insertion (i.e., longitudinal) direction of the rods.

In addition, a microfabricated abutment 234 forms a ledge disposed at the bottom of each cavity 230. During continued twisting insertion, the leading end of rod 226 will engage abutment 234, which serves as a microfabricated tactile feedback member to disrupt continued movement in the insertion direction. This tactile feedback alerts the assembler that the fully assembled orientation of components 226 and 222 has been reached. This tactile feedback helps prevent damage that may otherwise be occasioned by the assembler continuing to apply force in the insertion direction after the fully assembled position has been reached.

As with the other embodiments discussed herein, fingers 228 tend to be delicate, and susceptible to breakage, particularly as a result of over-extension during hand assembly, due to their microfabricated structure and relatively small width (e.g., about 300 to 500 μm) and long length (e.g., about 5 to 8 mm) in many embodiments. The fingers 228 are relatively long and slender, which provides the relatively brittle microfabricated structure with the desired flexibility, albeit at the expense of relatively high fragility. For example, in this embodiment, while the fingers 228 are flexible, they may only tolerate a few tens of micrometers of deflection. Thus, in particular embodiments, fingers 228 have been placed on support 222, between microfabricated layers to protect them from damage.

In addition, as best shown in FIG. 7A, at least two fingers 228 are associated with each cavity 230, to apply bias to each rod 226 in two mutually orthogonal directions, respectively towards two spaced abutment portions 233. These orthogonal biasing directions are provided by forming each pair of fingers 228 with mutually orthogonal moment arms 229 as shown. Once assembled, the rods 226 are firmly held in place by the bias of the microfabricated fingers 228, with the precision of the assembly being determined by the precision of the components (e.g., location of abutments 233 and diameter of rod 226), rather than on the accuracy of assembly. The lateral flexibility of the fingers provided by their relatively long moment arms allows the assembly to accommodate differential thermal expansion of the components or portions thereof, or consistent over/under-etching of the side-walls during processing, while maintaining the rods in precise relative orientation. Moreover, as mentioned above, this assembly approach enables the processes and material selection used to fabricate the rods 226 and the support 222 to be advantageously decoupled from one another.

Figure 8A:
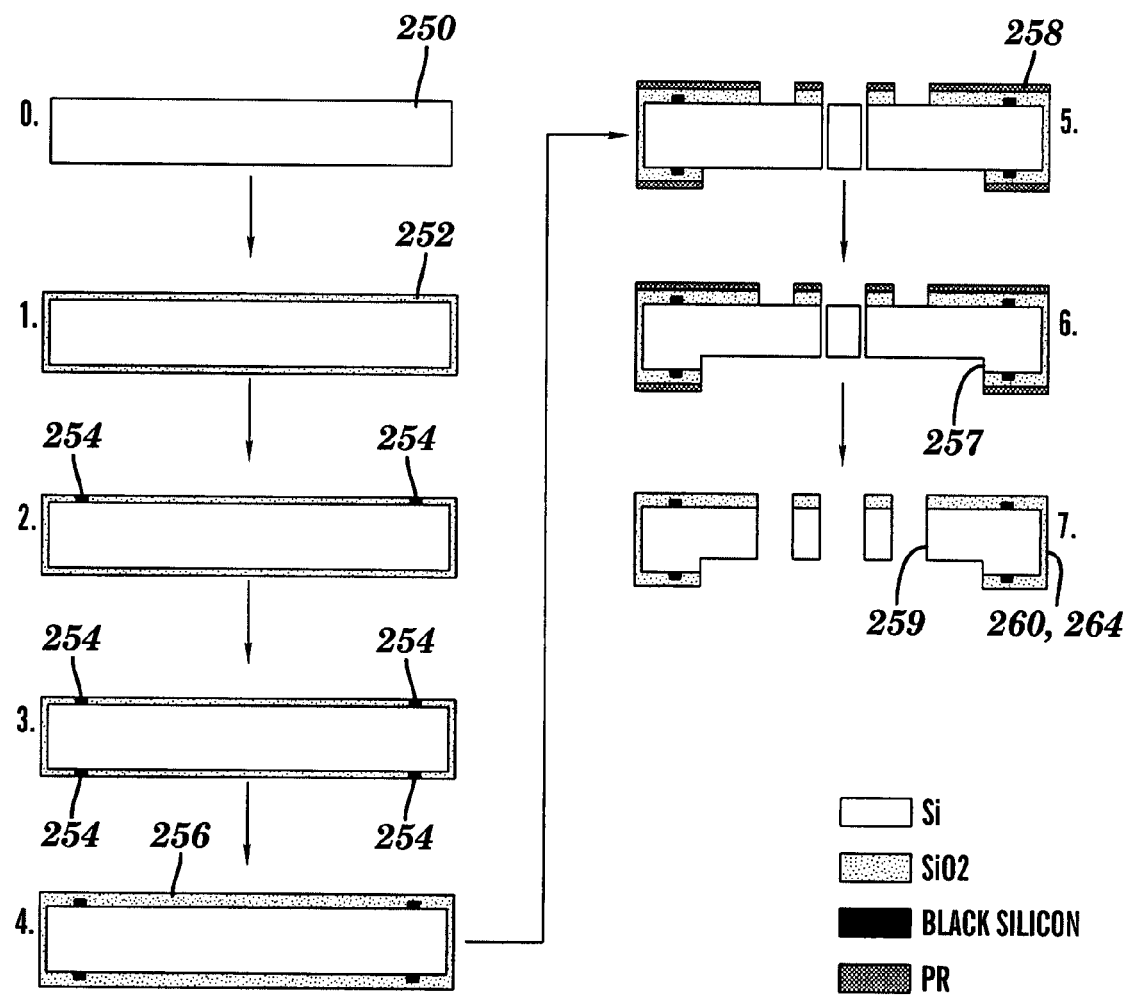
FIGS. 8A-8D are a series of simplified, cross-sectional views taken along 8-8 of FIG. 7B, during various steps in the fabrication of the embodiment of FIGS. 6-7B.
Figure 8B:
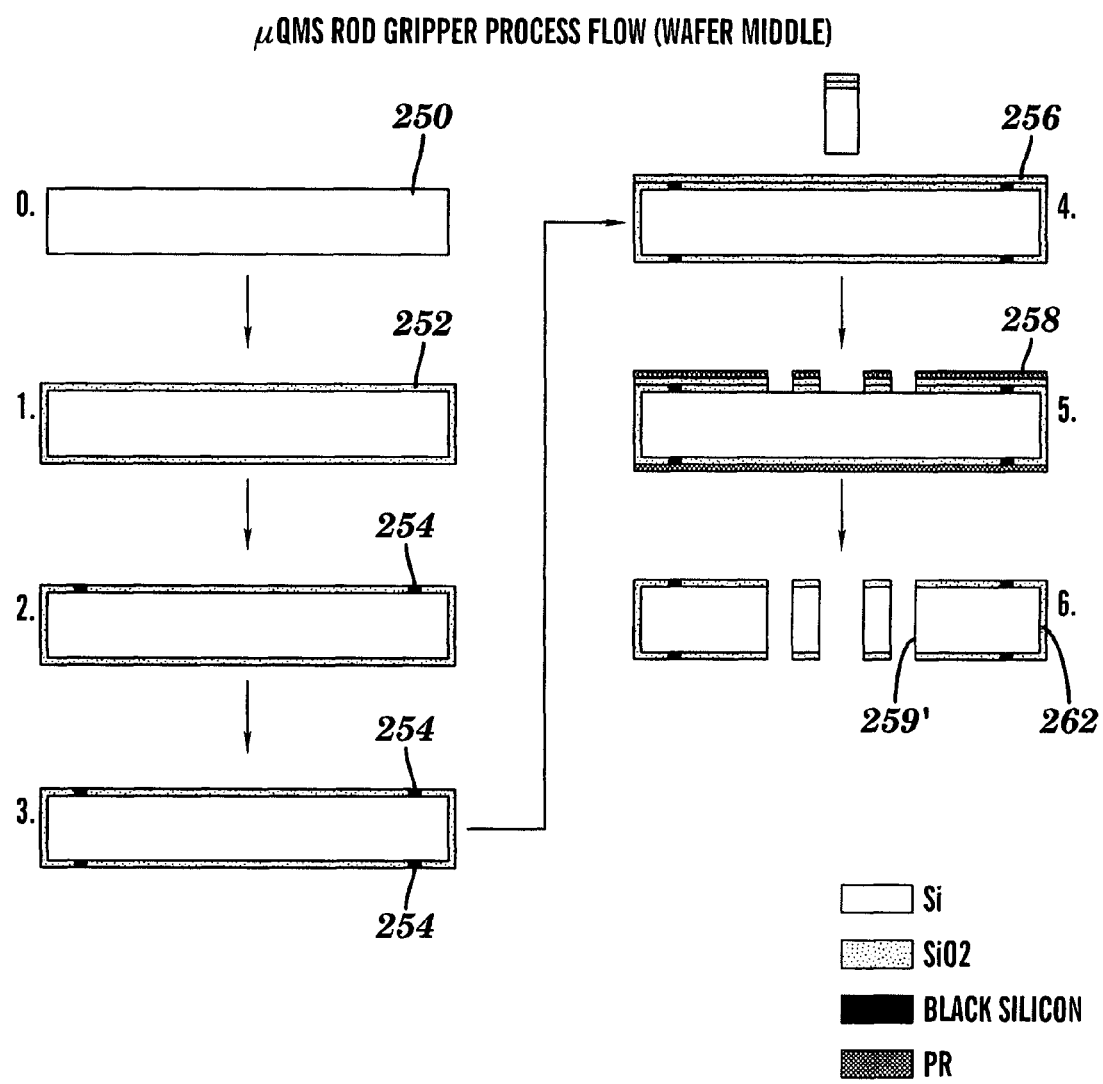
Figure 8C:
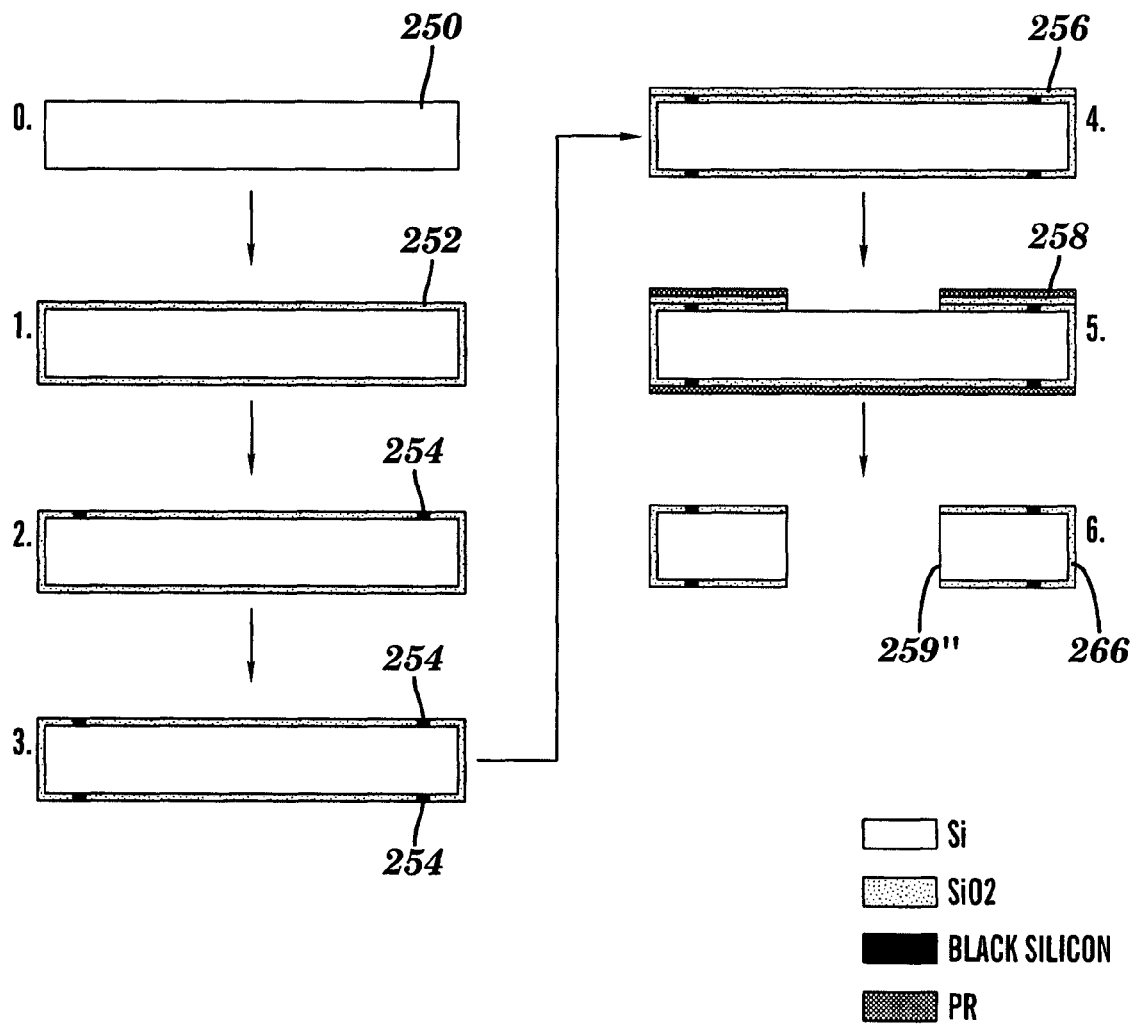
Figure 8D:
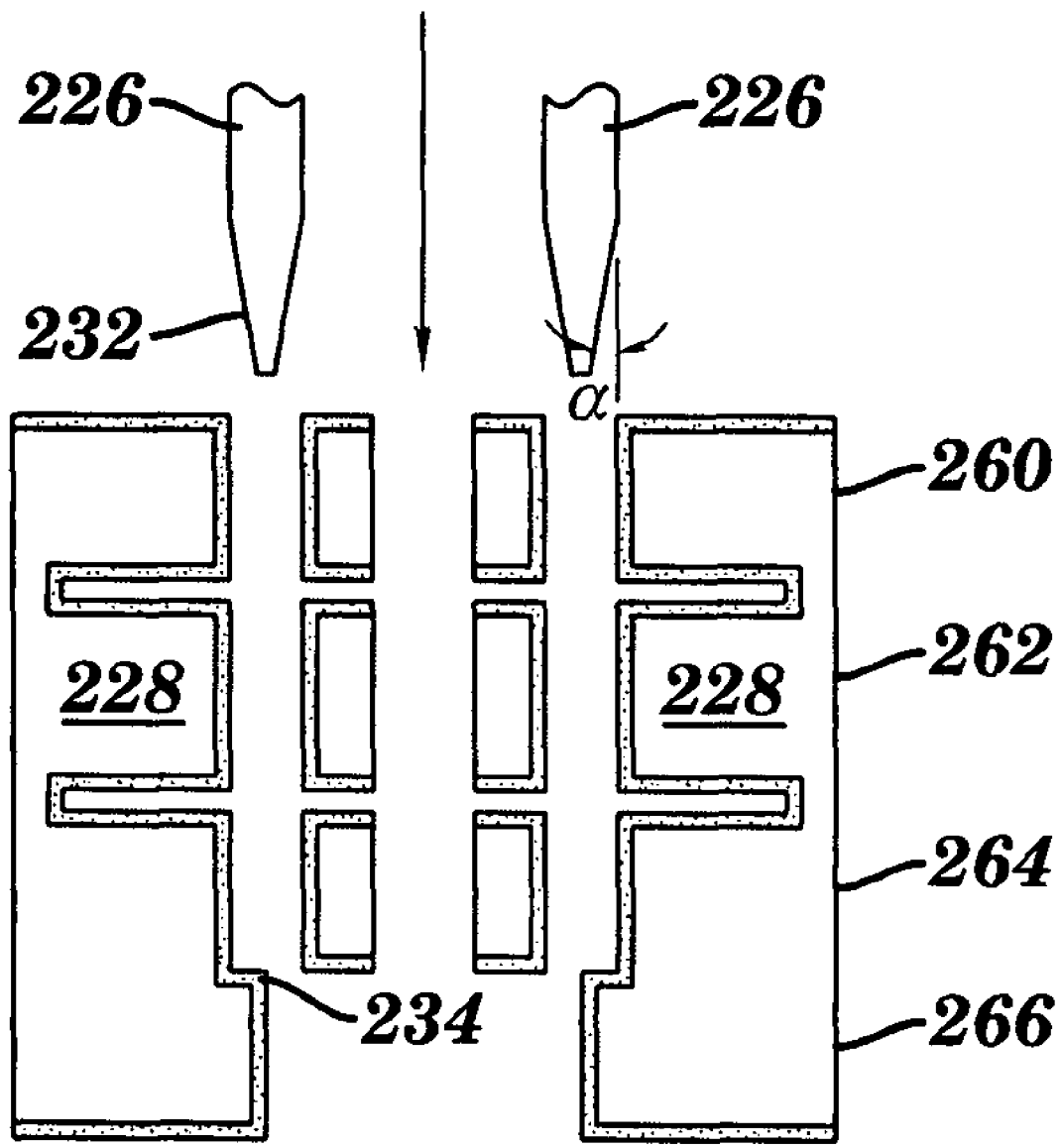

Turning now to FIGS. 8A-8D, the following is a description of a representative fabrication approach for assembly 220. As best shown in FIG. 8D, the embodiment shown includes four micro-fabricated layers, i.e., a top 260, middle 262, upper bottom 264 and lower bottom 266. (The terms 'top' and 'bottom' are merely used for convenience, and may be reversed without departing from the spirit and scope of the invention.)

As shown in FIG. 8A, fabrication of the top 260 and upper bottom 264 is nominally identical, although top 260 may utilize a thicker wafer than upper bottom 264 (e.g., about 1000+/−5 μm, and 500+/−5 μm, respectively). Fabrication of each of these layers begins with a wafer 250, followed by growth of an oxide layer 252 to protect the wafers for future fusion wafer bonding. Alignment marks 254 are transferred to opposite sides of the wafers as discussed hereinabove, followed by deposition of an oxide (SiO2) mask 256, which is patterned with a photo-resist 258 and then etched to selectively remove the oxide. The backside of the wafer is then DRIE etched to provide a clearance 257 for springs 228. The topside is also DRIE etched completely through the wafer to provide gaps at 259 to form cavities 230 (FIG. 7B).

As shown in FIG. 8B, middle layer 262 is fabricated substantially as described with respect to FIG. 8A, though without clearance 257, and with gaps 259' of smaller transverse dimension than gaps 259, to form fingers 228 (FIG. 7B). As shown in FIG. 8C, lower bottom layer 266 is fabricated substantially as described with respect to FIGS. 8A & 8B, though without clearance 257, and with a single, relatively large gap 259" to form abutment (ledge) 234 (FIGS. 7B, 8D). Using alignment marks 254, the four layers 260, 262, 264 and 266 are aligned with one another and then bonded to one another to form the completed assembly 220 as shown in FIG. 8D.

The following illustrative examples are intended to demonstrate certain aspects of the present invention. It is to be understood that these examples should not be construed as limiting.

EXAMPLES

Example 1

Generalized grid 126 and electrode 122 assemblies were fabricated substantially and shown and described hereinabove with respect to FIGS. 1-6, as microfabricated MEMS assemblies 120 fabricated from 650 μm thick silicon wafers. Grid 126 had a meso-scale transverse dimension $D_1$ of about 3 cm, and grid support 122 had a meso-scale transverse dimension $D_2$ of about 5 cm. Fingers 128 had a length of about 1.09 cm and a uniform width of about 550 μm. Other, similar examples were fabricated with fingers having tapered maximum widths of 700 μm and 1000 μm, respectively. The assemblies had an initial loose-fitting alignment (FIG. 4A) having clearance of about 0.5 mm, and an intermediate clearance (FIG. 4B) of about 50 μm. The components were successfully hand assembled, with resulting alignment accuracy within 8 micrometers standard deviation.

Example 2

Generalized grid 126 and electrode 122 assemblies were fabricated substantially as set forth in Example 1, though the grid was fabricated from polyimide using an excimer laser cutter. The components were successfully hand assembled to an alignment accuracy similar to that of Example 1, thus demonstrating the ability of these embodiments to enable the precise hand assembly of components microfabricated from mutually distinct materials.

Example 3

Generalized rod 226 and support 222 assemblies were fabricated substantially and shown and described hereinabove with respect to FIGS. 7A-8D, as microfabricated MEMS assemblies 220. The supports 222 were fabricated from 500 and 1000 μm thick silicon wafers. Rods 226 were fabricated from stainless steel, and had a meso-scale longitudinal dimension of about 1.5 cm, and a diameter of about 0.5 mm. The support 222 had a meso-scale transverse dimension $D_1$ of about 0.8 cm. Fingers 128 had moment arm lengths of about 0.5 cm and a uniform width within a range of about 300-500 μm. The assemblies had an initial loose-fitting alignment having clearance sufficient to enable assembly with hand tools, with resulting assembled alignment accuracy within about 5 μm. This example also demonstrates the ability of these embodiments to enable the precise hand assembly of components microfabricated from mutually distinct materials.

In the preceding specification, the invention has been described with reference to specific exemplary embodiments thereof. It will be evident that various modifications and changes may be made thereunto without departing from the broader spirit and scope of the invention as set forth in the claims that follow. The specification and drawings are accordingly to be regarded in an illustrative rather than restrictive sense.

Having thus described the invention, what is claimed is:

1. A hand assembled MEMS apparatus comprising:
a meso-scale first component;
a meso-scale second component;
at least one of said first and second components being a microfabricated MEMS device having a plurality of spring members co-located on a single wafer substrate;
said first and second components adapted for being moved by hand relative to one another in an assembly direction, from a relatively loose-fit preliminary alignment orientation to a relatively tight-fit assembled orientation;
said spring members configured to bias an other of said first and second components towards the assembled orientation;
at least one cam surface integrally disposed on the other of said first and second components, said cam surface configured to slidably engage and move said spring members against their biases upon continued hand movement in the assembly direction;
a microfabricated abutment disposed on at least one of said first and second components, said abutment disposed to limit relative movement of said first and second components in at least one direction other than the assembly direction;
said spring members configured to move independently of said abutment, wherein said abutment is configured to limit deflection of the spring members by the other of said first and second components; and
a microfabricated tactile feedback member disposed on at least one of said first and second components, said tactile feedback member configured to disrupt the hand movement in the assembly direction once said components have substantially reached said assembled orientation.

2. The apparatus of claim 1, wherein said tactile feedback member comprises a ledge disposed to impede continued movement in the assembly direction.

3. The apparatus of claim 2, wherein said abutment comprises a wall portion configured to restrict relative movement of said first and second components transverse to the assembly direction.

4. The apparatus of claim 3, wherein said wall portion is configured to limit movement of said cam surface generated by the bias of said spring members.

5. The apparatus of claim 2, comprising another ledge disposed to restrict movement of said cam surface in a disassembly direction.

6. The apparatus of claim 1, comprising an other cam surface configured to move said components into intermediate alignment upon hand movement in the assembly direction.

7. The apparatus of claim 1, wherein said meso-scale dimension is within a range of:
at least about 0.5 cm; and
about 10 cm.

8. The apparatus of claim 1, wherein said cam surface comprises a microfabricated cam surface.

9. The apparatus of claim 1, wherein said at least one cam surface is configured to move in a rotational assembly direction to slidably engage and move said spring members against their biases.

10. The apparatus of claim 1, wherein both of said first and second components are microlithographic.

11. The apparatus of claim 1, wherein said at least one microfabricated abutment comprises a plurality of microlithographic abutments.

12. The apparatus of claim 1, wherein said abutment is disposed to limit movement of said first and second components relative to one another in at least one direction transverse to the assembly direction.

13. The apparatus of claim 1, wherein said abutment is disposed to limit movement of said first and second components relative to one another in a disassembly direction.

14. The apparatus of claim 1, wherein said tactile feedback member comprises an engagement surface disposed substantially transverse to the assembly direction.

15. The apparatus of claim 1, wherein said tight-fit assembled orientation is one or more orders of magnitude tighter than said loose-fit preliminary alignment orientation.

16. The apparatus of claim 15, wherein said tight-fit assembled orientation comprises alignment within tens of micrometers.

17. A method for fabricating a hand assemblable apparatus, the method comprising:
(a) providing a meso-scale first component;
(b) providing a meso-scale second component, wherein at least one of said first and second components is a microfabricated MEMS device having a plurality of spring members co-located on a single water substrate;
(c) adapting the first and second components for being moved by hand relative to one another in an assembly direction, from a relatively loose-fit preliminary alignment orientation to a relatively tight-fit assembled orientation;
(d) configuring said spring members to bias an other of said first and second components towards the assembled orientation;
(e) integrally disposing at least one cam surface on the other of said first and second components, said cam surface configured to slidably engage and move said spring members against their biases upon continued hand movement in the assembly direction;
(f) disposing a microfabricated abutment on at least one of said first and second components, said abutment disposed to limit relative movement of said first and second components in at least one direction other than the assembly direction, wherein said spring members are configured to move independently of said abutment, and said abutment is configured to limit deflection of the spring members by the other of said first and second components; and (g) disposing a microfabricated tactile feedback member on at least one of said first and second components, said tactile feedback member configured to disrupt the hand movement in the assembly direction once said components have substantially reached said assembled orientation.

18. The method of claim 17, wherein said tactile feedback member comprises a ledge disposed to impede continued movement in the assembly direction.

19. The method of claim 17, wherein said abutment comprises a wall portion configured to restrict relative movement of said first and second components transverse to the assembly direction.

20. The method of claim 19, wherein said wall portion is configured to limit movement of said cam surface generated by the bias of said spring members.

21. The method of claim 17, wherein said meso-scale dimension is within a range of:
   at least about 0.5 cm; and
   about 10 cm.

22. The method of claim 17, wherein said cam surface is configured to move in a rotational assembly direction to slidably engage and move said spring members against their biases.

23. The method of claim 17, wherein said abutment is disposed to limit movement of said first and second components relative to one another in at least one direction transverse to the assembly direction.

24. The method of claim 17, wherein said abutment is disposed to limit movement of said first and second components relative to one another in a disassembly direction.

25. The method of claim 17, wherein said tight-fit assembled orientation is one or more orders of magnitude tighter than said loose-fit preliminary alignment orientation.

26. The method of claim 25, wherein said tight-fit assembled orientation comprises alignment within tens of micrometers.

27. A hand assembled apparatus comprising:
a microlithographic, meso-scale first component;
a microlithographic, meso-scale second component;
at least one of said first and second components being a MEMS device having a plurality of spring members co-located on a single wafer substrate;
said first and second components adapted for being moved relative to one another in an assembly direction;
said spring members configured to bias the other of said first and second components towards an assembled orientation;
a microlithographic cam surface integrally disposed on the other of said first and second components, said cam surface configured to move in a rotational assembly direction to slidably engage and move said spring members against their biases;
a plurality of microlithographic abutments disposed on at least one of said first and second components, said abutments disposed to limit movement of said first and second components relative to one another in at least one direction other than the rotational assembly direction;
said spring members configured to move independently of said abutment, wherein said abutment is configured to limit deflection of the spring members by the other of said first and second components;
a microlithographic tactile feedback member disposed on at least one of said first and second components, said tactile feedback member configured to disrupt movement in the assembly direction once said components have substantially reached said assembled orientation.

28. The apparatus of claim 1, wherein the spring members are elongated, having:
   a moment arm length within a range of about 0.5 to 1.0 cm; and
   a width within a range of about 300 to 1000 μm.

* * * * *

UNITED STATES PATENT AND TRADEMARK OFFICE
CERTIFICATE OF CORRECTION

| | | |
|---|---|---|
| PATENT NO. | : 7,900,336 B2 | Page 1 of 1 |
| APPLICATION NO. | : 11/404676 | |
| DATED | : March 8, 2011 | |
| INVENTOR(S) | : Akintunde Ibitayo Akinwande et al. | |

It is certified that error appears in the above-identified patent and that said Letters Patent is hereby corrected as shown below:

Column 12, Line 45, "water", should read --wafer--.

Signed and Sealed this
Fifth Day of July, 2011

David J. Kappos
*Director of the United States Patent and Trademark Office*